(12) United States Patent
Ma

(10) Patent No.: US 7,025,603 B2
(45) Date of Patent: Apr. 11, 2006

(54) LAND GRID ARRAY CONNECTOR ASSEMBLY WITH STIFFENER

(75) Inventor: Hao-Yun Ma, Tu-chen (TW)

(73) Assignee: Hon Hai Precision Ind. Co., Ltd., Taipei Hsein (TW)

( * ) Notice: Subject to any disclaimer, the term of this patent is extended or adjusted under 35 U.S.C. 154(b) by 0 days.

(21) Appl. No.: 10/605,119

(22) Filed: Sep. 9, 2003

(65) Prior Publication Data

US 2004/0142584 A1 Jul. 22, 2004

(30) Foreign Application Priority Data

Jan. 22, 2003 (TW) .................................. 92201188 U

(51) Int. Cl.
*H01R 13/62* (2006.01)

(52) U.S. Cl. .......................................... 439/73; 439/331
(58) Field of Classification Search .................. 439/73, 439/331
See application file for complete search history.

(56) References Cited

U.S. PATENT DOCUMENTS

| 5,344,334 A | | 9/1994 | Laub et al. ............... 439/331 |
| 6,106,317 A | * | 8/2000 | Michaelis et al. ........ 439/331 |
| 6,726,500 B1 | * | 4/2004 | McHugh et al. .......... 439/331 |

* cited by examiner

*Primary Examiner*—Renee Luebke
(74) *Attorney, Agent, or Firm*—Wei Te Chung

(57) ABSTRACT

An electrical connector (1) for electrically connecting an electronic package with a circuit substrate. The connector includes a housing (11), a fastening device assembled with the housing, and a stiffener (12) surrounding the housing. The stiffener includes a back end (123), and a pair of spaced first walls (125) adjoining the back end. Each first wall has a latch (128) extending upwardly therefrom, and then bends inwardly. The back end has a pair of spaced spring fingers (129) extending substantially horizontally, and then bends slightly upwardly. The latches are fastened to the housing for locating the housing in a vertical direction. The spring fingers abut against the housing for locating the housing in a horizontal direction. The stiffener reinforces the housing, and protects the housing from deformation or warpage.

20 Claims, 7 Drawing Sheets

LAND GRID ARRAY CONNECTOR ASSEMBLY WITH STIFFENER

BACKGROUND OF INVENTION

1. Field of the Invention

The present invention relates to an electrical connector for electrically connecting an electronic package such as a central processing unit (CPU) with a circuit substrate such as a printed circuit board (PCB), and particularly to a land grid array connector having a stiffener for protecting the connector from deformation or warpage.

2. Description of Related Art

An integrated circuit (IC) package having leads arranged in a land grid array (LGA) is known as an LGA package. LGA packages have relatively low height, which saves valuable space in electronic assemblies.

Connectors for removably mounting an LGA package on a PCB are known as LGA connectors. An LGA connector combined with ball grid array (BGA) technology typically comprises a thin and substantially flat insulative housing which is positioned between the LGA package and the PCB. The housing defines an array of passageways receiving electrical terminals therein. The terminals correspond with the array of leads of the LGA package. Each terminal has a pair of opposite free ends that project beyond opposite top and bottom external surfaces of the housing. Prior to mounting of the LGA package on the PCB, the free ends are spaced apart a predetermined distance. The free ends are respectively engaged with corresponding contact pads on a bottom surface of the LGA package, and soldered to contact pads on a mounting surface of the PCB.

FIG. 7 shows a conventional LGA connector 9 for electrically connecting an LGA package 8 with a PCB (not shown). The connector 9 comprises a housing 91, and a fastening device assembled with the housing 91. The housing 91 has a plurality of passageways (not shown) defined therein. Each passageway has a conductive terminal (not shown) received therein. The fastening device comprises a metal clip 93 and a lever 92 mounted on opposite sides of the housing 91 respectively. The metal clip 93 comprises a pair of locating portions 932, a pair of opposite lateral pressing arms 931, and a driving hook 933 at a free end thereof generally between distal ends of the pressing arms 931. Each locating portion 932 is movably received in a groove 912 of the housing 91. Each pressing arm 931 is bent slightly downwardly at a middle portion 934 thereof. The lever 92 comprises a pair of acting portions 923, a driving portion 922 disposed between and offset from the acting portions 923, and a handle portion 921 bent perpendicularly from a distal end of one of the acting portions 923. Each acting portion 923 is secured in a lock 913 of the housing 91.

In use, the clip 93 is firstly rotated to be perpendicular to the housing 91. The handle portion 921 of the lever 92 is horizontal, and the driving portion 922 is at a highest position. The LGA package 8 is attached on the housing 91. The clip 93 is rotated down to a horizontal position, with the pressing arms 931 abutting against the LGA package 8. The handle portion 921 of the lever 92 is rotated upwardly to be perpendicular to the housing 91, and the driving portion 922 of the lever 92 is received in the driving hook 933 of the clip 93. The handle portion 921 of the lever 92 is rotated down toward the clip 93, and the driving hook 933 is driven downwardly until the clip 93 is in a final pressing position, with the pressing arms 931 firmly pressing the LGA package 8 on the housing 91.

At the final pressing position, the middle portions 934 of the pressing arms 931 apply downward forces on middle portions (not labeled) of the housing 91. The housing 91 at the grooves 912 applies downward forces on the locating portions 932 of the clip 93, thereby locating the locating portions 932 in the grooves 912. The locating portions 932 apply upward counterforces on the housing 91 at the grooves 912. The acting portions 923 of the lever 92 are secured in the locks 913 of the housing 91, with the locks 913 of the housing 91 applying downward forces on the acting portions 923. The acting portions 923 apply upward counterforces on the locks 913 of the housing 91.

Because the housing 91 has a plurality of passageways, a main body of the housing 91 is relatively weak. The housing 91 is subjected to the above-described downward forces acting on the middle portions thereof, and the above-described upward forces acting on two opposite end portions (not labeled) thereof. The opposite ends of the housing 91 are thus prone to warp upwardly and deform the housing 91. When this happens, the clip 93 cannot firmly press the LGA package 8. Therefore, the electrical connection between the conductive terminals of the connector 9 and conductive pads (not shown) of the LGA package 8 may be unstable or even lost.

In view of the above, a new land grid array connector assembly that overcomes the above-mentioned disadvantages is desired.

SUMMARY OF INVENTION

Accordingly, an object of the present invention is to provide an electrical connector assembly such as a land grid array (LGA) connector assembly for electrically connecting an electronic package such as an LGA central processing unit (CPU) with a circuit substrate such as a printed circuit board (PCB), whereby the LGA connector assembly has a stiffener for protecting the connector from deformation or warpage.

To achieve the above-mentioned objects, an LGA connector assembly in accordance with a preferred embodiment of the present invention is for electrically connecting an LGA CPU with a PCB. The LGA connector assembly comprises a housing with a plurality of conductive terminals received therein, a fastening device assembled with the housing, and a stiffener surrounding the housing. The stiffener comprises a back end, and a pair of spaced first walls respectively adjoining the back end. Each first wall forms a latch thereon. Each latch extends upwardly from the corresponding first wall, and then bends inwardly. The back end forms a pair of spaced spring fingers thereon. Each spring finger extends substantially horizontally, and then bends slightly upwardly. The latches are fastened to the housing for locating the housing in a vertical direction. The spring fingers abut against the housing for locating the housing in a horizontal direction. The stiffener reinforces the housing, and protects the housing from deformation or warpage.

Other objects, advantages and novel features of the invention will become more apparent from the following detailed description when taken in conjunction with the accompanying drawings, in which:

DETAILED DESCRIPTION

Reference will now be made to the drawings to describe the present invention in detail.

Figure 1:
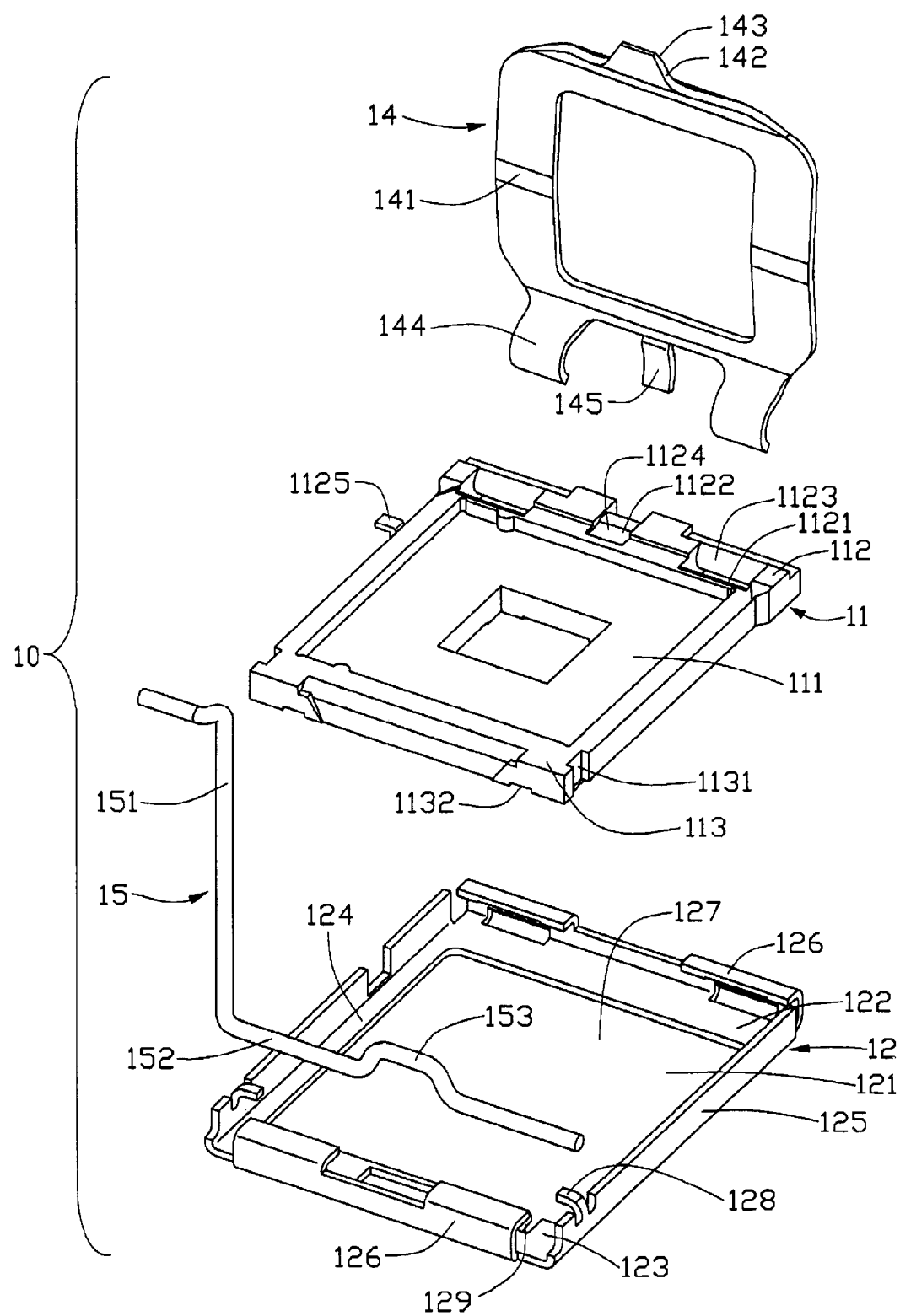
FIG. 1 is an exploded, isometric view of a land grid array connector in accordance with the preferred embodiment of the present invention.

Referring to FIG. 1, a land grid array (LGA) connector 10 in accordance with the preferred embodiment of the present invention is for electrically connecting a land grid array (LGA) package (not shown) with a printed circuit board (PCB) (not shown). The connector 10 comprises an insulative housing 11 with a plurality of conductive terminals (not shown) received therein, a fastening device assembled with the housing 11, and a stiffener 12 surrounding the housing 11. The fastening device comprises a metal clip 14 and a lever 15 mounted on opposite sides of the housing 11 respectively.

Figure 3:
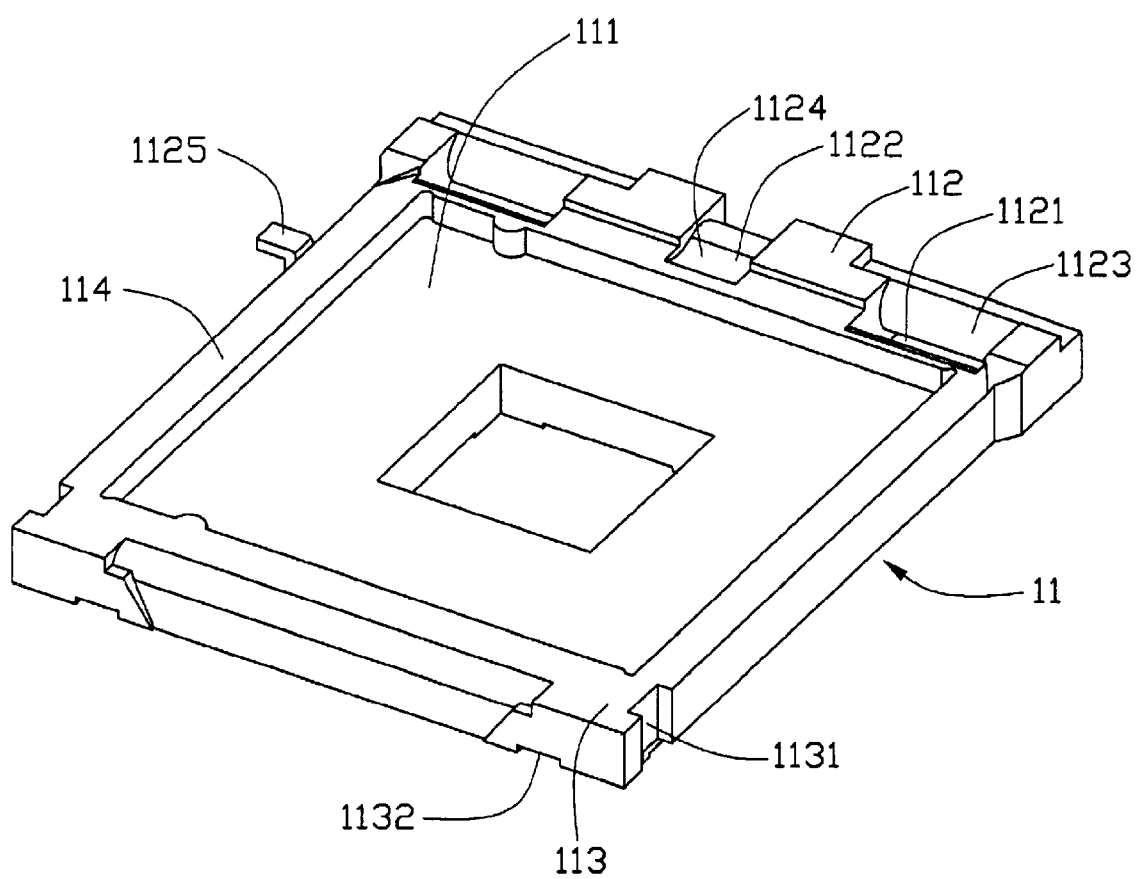
FIG. 3 is an enlarged view of a housing of the connector of FIG. 1.

FIG. 3 shows the housing 11 of the connector 10. The housing 11 is generally rectangular, and comprises a main body 111. A plurality of receiving passageways (not shown) is defined in the main body 11, the receiving passageways receiving corresponding terminals therein. The housing 11 further comprises a head portion 112 extending from a first end (not labeled) of the main body 111, a rear portion 113 extending from a second end (not labeled) of the main body 111 opposite from the head portion, and a pair of opposite side walls 114 respectively interconnecting the head and rear portions 112, 113.

The head portion 112 defines a pair of spaced first retaining slots 1121, and a second retaining slot 1122 between the first retaining slots 1121. A pair of first arcuate retaining surfaces 1123 is defined on the head portion 112 at the corresponding first retaining slots 1121. A second arcuate retaining surface 1124 is defined on the head portion 112 at the second retaining slot 1122. The rear portion 113 defines a top surface 1133 (see FIG. 4), and a pair of spaced locating slots 1132 in a bottom surface thereof. Each side wall 114 defines a guiding slot 1131 at the rear portion 113. Each guiding slot 1131 runs through an entire height of the corresponding side wall 114. One side wall 114 has a lock 1125 formed thereon, near the head portion 112.

Figure 2:
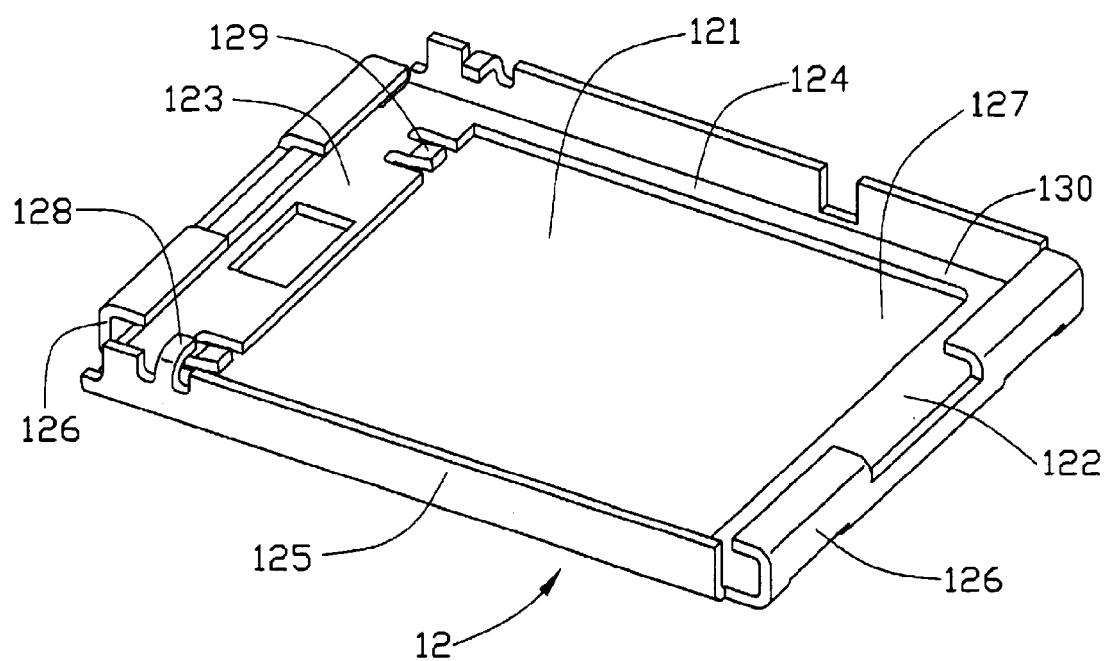
FIG. 2 is an enlarged view of a stiffener of the connector of FIG. 1, viewed from another aspect.

FIG. 2 shows the stiffener 12 of the connector 10. The stiffener 12 is made of strong material, preferably metal. The stiffener 12 comprises a substantially rectangular supporting portion 124. The supporting portion 124 comprises a front end 122, a back end 123 opposite to the front end 122, and a pair of sides 130 respectively interconnecting the front and back ends 122, 123. The front and back ends 122, 123, and sides 130 cooperatively define a central opening 121 therebetween. Each side 130 has a first wall 125 extending therefrom, and the front and back ends 122, 123 each have a second wall 126 extending therefrom. The first walls 125 extend upwardly from the sides 130. The second walls 126 extend upwardly from the front and back ends 122, 123, and then bend inwardly and extend in opposite horizontal directions. The first and second walls 125, 126 cooperatively define a receiving space 127 therebetween.

The stiffener 12 further comprises a pair of latches 128 formed on the first walls 125 respectively near the back end 123, and a pair of spaced spring fingers 129 on the back end 123 adjacent the opening 121. Each latch 128 extends upwardly from the corresponding first wall 125, and then bends inwardly. Each spring finger 129 extends substantially horizontally, and then bends slightly upwardly.

The clip 14 comprises a pair of first locating portions 144 respectively secured in the first retaining slots 1121 and optionally further freely or supportably extending into the corresponding openings (not labeled) at the corner of the second wall 126 and the front end 122 when the clip 14 is in a horizontal locking position, and a second locating portion 145 between the first locating portions 144. The clip 14 further comprises a pair of opposite lateral pressing arms 141, and a driving hook 142 at a free end thereof generally between distal ends of the pressing arms 141. The pressing arms 141 are bent slightly downwardly in a middle thereof. The driving hook 142 has a mating surface 143 defined thereon.

The lever 15 comprises a pair of acting portions 152 respectively received in the space 2 of the connector 10 (see FIG. 5) and supportably restrained by the corresponding second wall 126 and the ends of corresponding first wall 125, a driving portion 153 disposed between and offset from the acting portions 151, and a handle portion 151 bent perpendicularly from a distal end of one of the acting portions 152.

Figure 4:
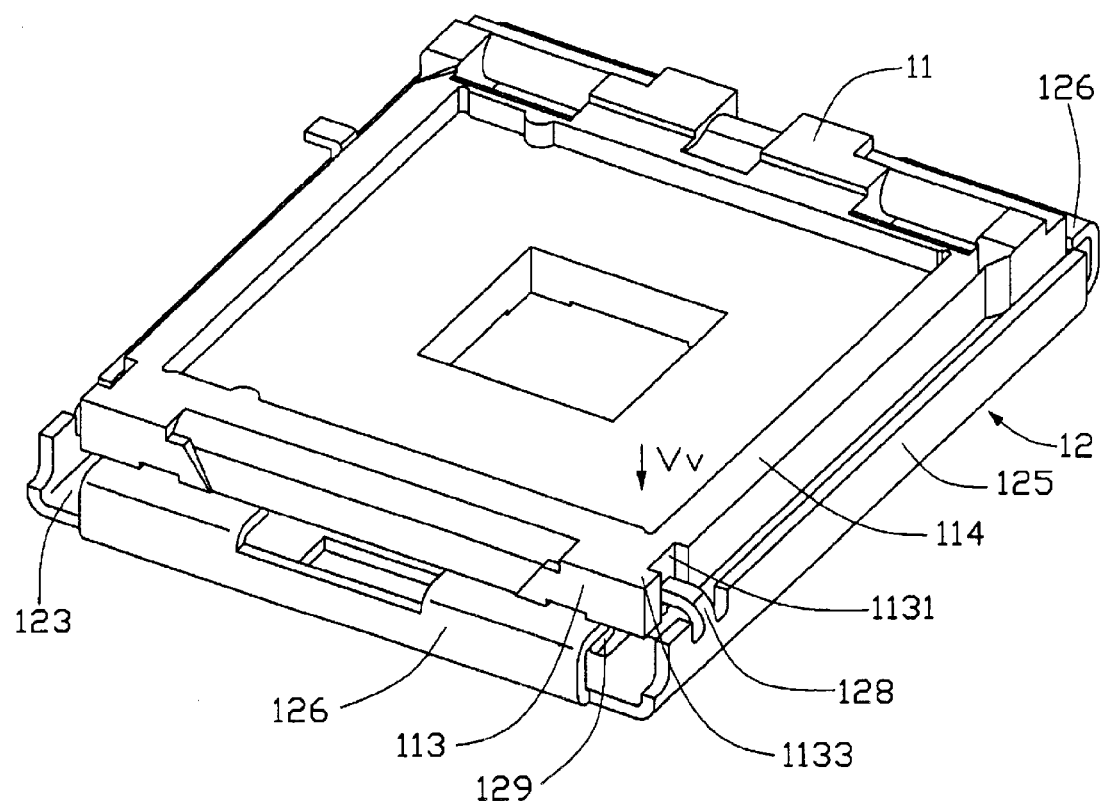
FIG. 4 is an isometric view of the housing of FIG. 3 being attached in the stiffener of FIG. 2.
Figure 5:
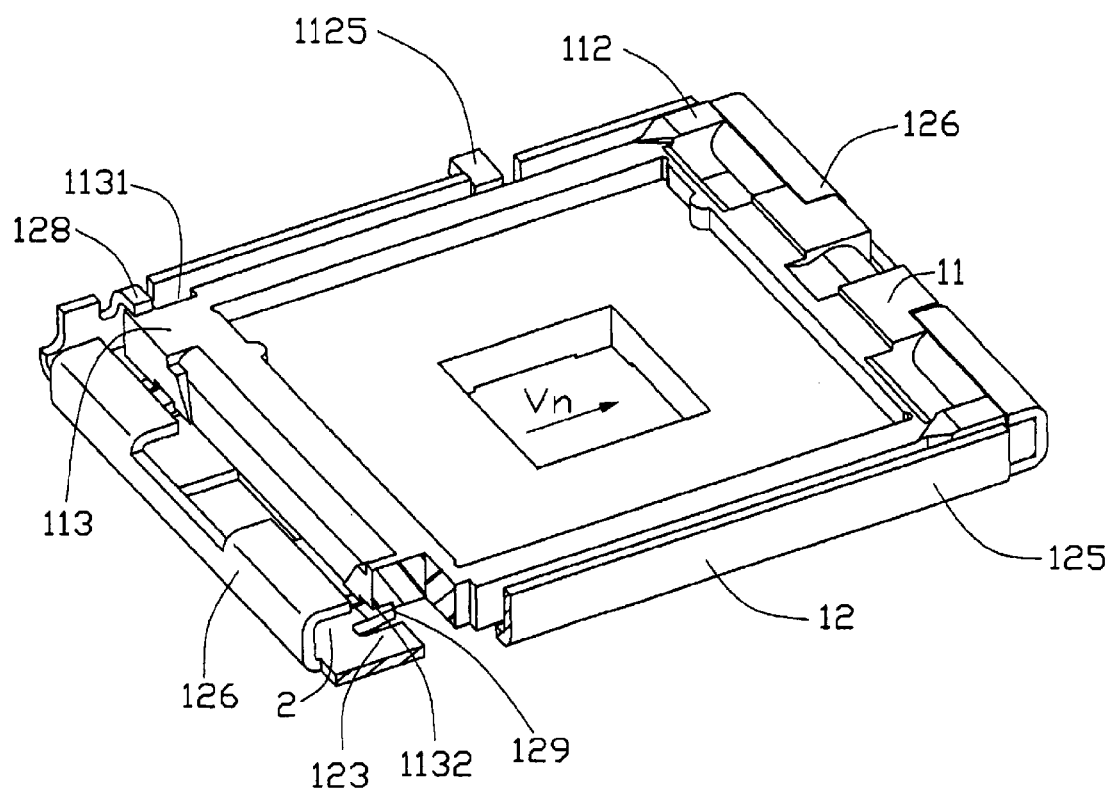
FIG. 5 is similar to FIG. 4, but showing the housing fully attached in the stiffener, and the housing and the stiffener being partly cut away.

Referring to FIGS. 1, 4 and 5, assembly of the housing 11 with the stiffener 12 is as follows. Firstly, the guiding slots 1131 of the housing 11 are aligned with the corresponding latches 128 of the stiffener 12. Then, the housing 11 is inserted into the receiving space 127 of the stiffener 12 along the direction "Vv." At this position, the spring fingers 129 are pressed by the housing 11. The latches 128 mate in the corresponding guiding slots 1131. Then, the housing 11 is slid toward the front end 122 of the stiffener 12 along the direction "Vh," until the head portion 112 of the housing 11 engages with the second wall 126 of the front end 122 of the stiffener 12, and the space 2 is defined between the rear portion 113 of the housing 11 and the second wall 126 of the back end 123 of the stiffener 12. The second wall 126 locates the head portion 112 of the housing 11 both in a horizontal forward direction and in vertical directions. When the housing 11 is slid away from the back end 123 of the stiffener 12, the spring fingers 129 spring upwardly to engage in the corresponding locating slots 1132. Thus, the housing 11 is prevented from sliding back toward the back end 123 of the stiffener 12, and is located in a horizontal rearward direction. At this position, the latches 128 of the stiffener 12 are fittingly engaged on the top surface 1133 of the rear portion 113 of the housing 11. The rear portion 113 of the housing 11 is thereby located in vertical directions.

Figure 6:
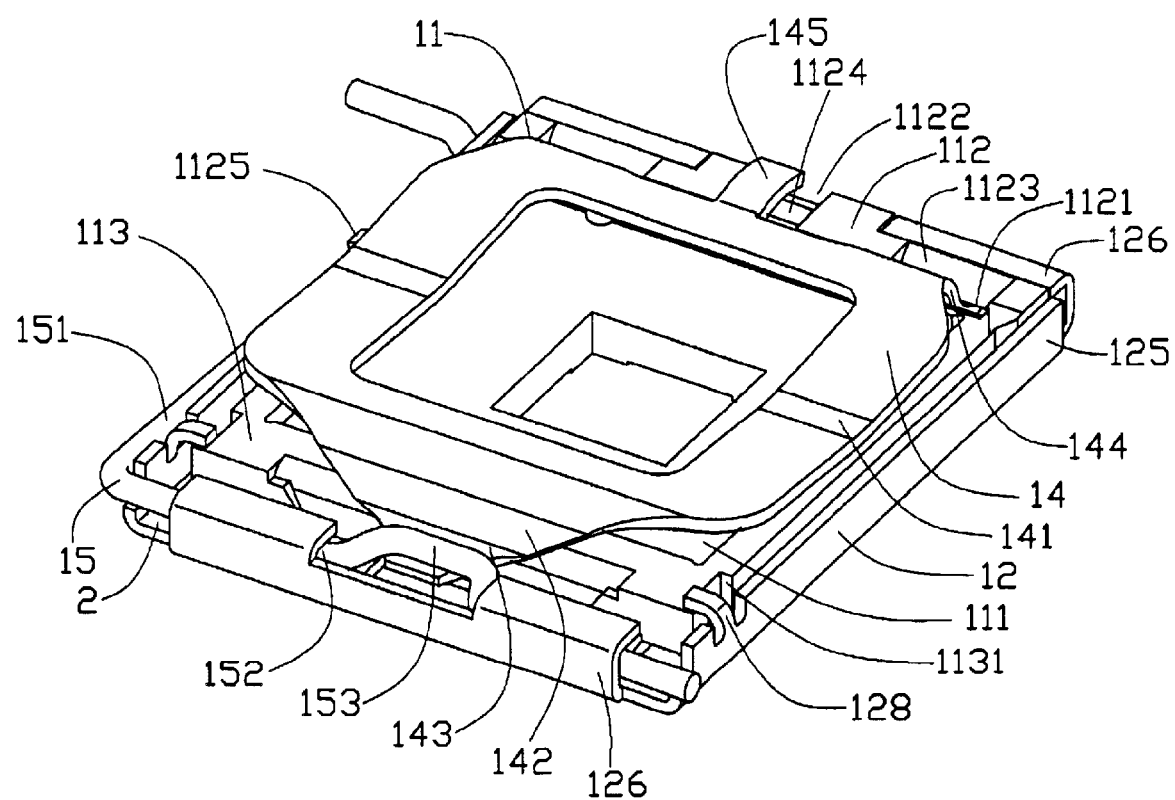
FIG. 6 is an assembled view of FIG. 1.
Figure 7:
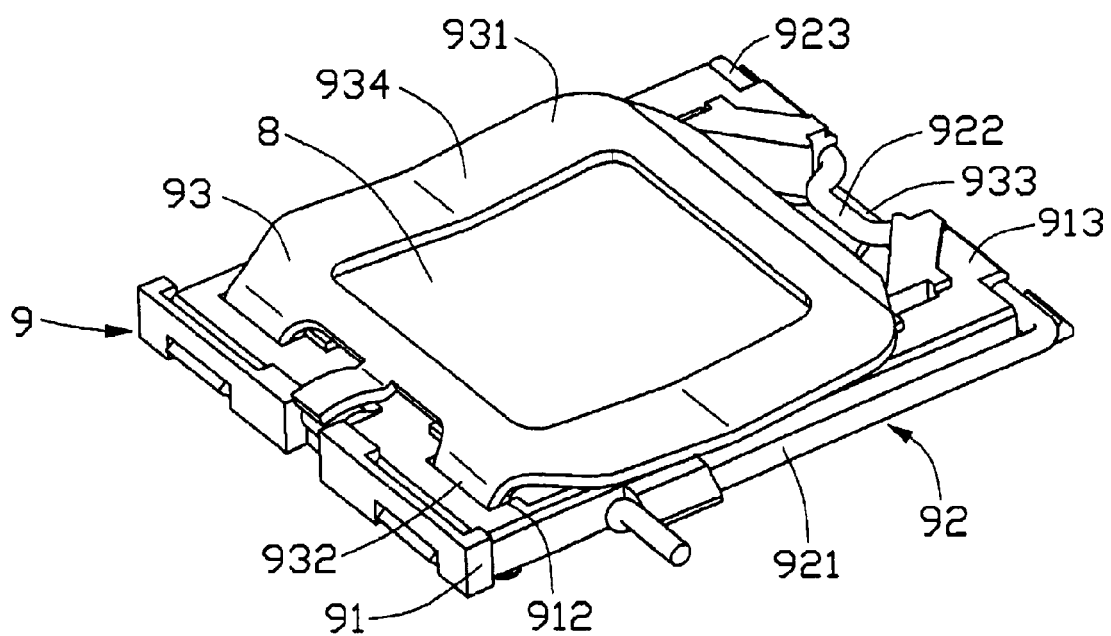
FIG. 7 is an isometric view of a conventional land grid array connector.

FIG. 6 shows the connector 10 fully assembled. The first locating portions 144 of the clip 14 are movably engaged on the corresponding first retaining surfaces 1123, and the second locating portion 145 of the clip 14 is movably engaged on the second retaining surface 1124. In use, the clip 14 is rotated to be perpendicular to the housing 11 in a vertical open position. This enables the LGA package to be attached on the housing 11. In the open position, the handle portion 151 of the lever 15 is horizontal. Then, the clip 14 is rotated to a substantially horizontal position, with the pressing arms 141 of the clip 14 resting on the LGA package. The handle portion 151 of the lever 15 is rotated upwardly to be perpendicular to the housing 11. In this position, the driving portion 153 of the lever 15 is received in the driving hook 142, and engages with the mating surface 143 of the driving hook 142. The handle portion 151 of the lever 15 is rotated down toward the clip 14 until it is locked by the lock 1125. In this position, the lever 15 is at a horizontal closed position, with the driving portion 153 pressing the driving hook 142 of the clip 14 downwardly. Accordingly, the pressing arms 141 resiliently press the LGA package. Therefore, the LGA package is securely attached on the housing 11, and the conductive pads (not shown) of the LGA package are electrically connected with the terminals of the housing 11 securely.

At the closed position, the pressing arms 141 apply downward forces on middle portions (not labeled) of the housing 11. The first retaining surfaces 1123 of the housing 11 apply downward forces on the first locating portions 144 of the clip 14, thereby locating the locating portions 144 thereat. The locating portions 144 apply upward counter-forces on the retaining surfaces 1123.

The strong, metallic stiffener 12 surrounds the housing 11. The second wall 126 of the front end 122 of the stiffener 12 locates the head portion 112 of the housing 11 in a horizontal direction and in vertical directions. The spring fingers 129 of the stiffener 12 locate the housing 11 in an opposite horizontal direction. The latches 128 of the stiffener 12 locate the rear portion 113 of the housing 11 in vertical directions. Therefore, when the housing 11 is subjected to the above-described downward forces on the middle portion thereof and the upward forces on the head portion 112, the stiffener 12 reinforces the housing 11 and protects the housing 11 from deforming or warpage. Accordingly, reliable electrical connection between the terminals of the connector 10 and the conductive pads of the LGA package can be maintained.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, the connector comprising:
   an insulative housing with a plurality of conductive terminals received therein; and
   a stiffener substantially surrounding the housing;
   a metal clip and a lever mounted on opposite sides of the housing;
   wherein the stiffener comprises at least one spring finger extending therefrom for locating the housing in a horizontal direction, and at least one latch extending therefrom for locating the housing in a vertical direction.

2. The electrical connector as claimed in claim 1, wherein the housing comprises a rear portion, the housing defines at least one guiding slot in a side thereof, and the rear portion defines at least one locating slot in a bottom thereof.

3. The electrical connector as claimed in claim 2, wherein the at least one spring finger of the stiffener is located in the at least one locating slot of the housing, and the at least one latch of the stiffener mates in the at least one guiding slot and is engaged on a top surface of the housing.

4. The electrical connector as claimed in claim 3, wherein the stiffener comprises a substantially rectangular supporting portion, the supporting portion comprises a front end, a back end, and a pair of sides respectively interconnecting the front and back ends, and the front and back ends and the sides cooperatively define a central opening therebetween.

5. The electrical connector as claimed in claim 4, wherein each side has a first wall extending therefrom, and the front and back ends each have a second wall extending therefrom.

6. The electrical connector as claimed in claim 5, wherein the first walls extend substantially upwardly from the sides, and the second walls extend substantially upwardly from the respective front and back ends and then bend inwardly and extend in substantially horizontal directions.

7. The electrical connector as claimed in claim 6, wherein the at least one latch is provided on at least one of the first walls, near the back end.

8. The electrical connector as claimed in claim 7, wherein the at least one latch extends substantially upwardly from said at least one of the first walls, and then bends inwardly.

9. The electrical connector as claimed in claim 6, wherein the at least one spring finger is defined on the back end of the supporting portion, adjacent the opening.

10. The electrical connector as claimed in claim 9, wherein the at least one spring finger extends substantially in a horizontal direction, and then bends slightly upwardly.

11. A land grid array (LGA) connector for electrically connecting an LGA package with a circuit substrate, the LGA connector comprising:
    a dielectric housing with a plurality of conductive terminals received therein;
    a stiffener surrounding the housing; and
    a metal clip and a lever mounted on opposite sides of the housing;
    wherein the stiffener comprises a pair of spaced spring fingers and a pair of latches securing the housing therein.

12. The LGA connector as claimed in claim 11, wherein the housing comprises a rear portion, the housing defines a pair of guiding slots in opposite sides thereof, and the rear portion defines a pair of spaced locating slots in the bottom surface.

13. The LGA connector as claimed in claim 12, wherein the spring fingers of the stiffener are located in the locating slots of the housing, and the latches of the stiffener mate in the corresponding guiding slots and are engaged on the top surface of the housing.

14. The LGA connector as claimed in claim 13, wherein the stiffener comprises a substantially rectangular supporting portion, the supporting portion comprises a front end, a back end, and a pair of sides respectively interconnecting the front and back ends, and the front and back ends and the sides cooperatively define a central opening therebetween.

15. The LGA connector as claimed in claim 14, wherein each side has a first wall extending therefrom, and the front and back ends respectively each have a second wall extending therefrom.

16. The LGA connector as claimed in claim 15, wherein the first walls extend substantially upwardly from the sides, and the second walls extend substantially upwardly from the respective front and back ends, and then bend inwardly and extend in substantially horizontal directions.

17. The LGA connector as claimed in claim 16, wherein the latches are respectively provided on the corresponding first walls, near the back end.

18. The LGA connector as claimed in claim 17, wherein each latch extends substantially upwardly from the corresponding first wall, and then bends inwardly.

19. The LGA connector as claimed in claim 16, wherein the spring fingers are defined on the back end of the supporting portion, adjacent the opening.

20. The LGA connector as claimed in claim 19, wherein the spring fingers extend substantially in a horizontal direction, and then bend slightly upwardly.

* * * * *